United States Patent (10) Patent No.: US 11,431,535 B2
Fu et al. (45) Date of Patent: Aug. 30, 2022

(54) MULTIPLE SINUSOID SIGNAL SUB-NYQUIST SAMPLING METHOD BASED ON MULTI-CHANNEL TIME DELAY SAMPLING SYSTEM

(71) Applicant: Harbin Institute of Technology, Harbin (CN)

(72) Inventors: Ning Fu, Harbin (CN); Zhiliang Wei, Harbin (CN); Liyan Qiao, Harbin (CN); Zhenlong Yan, Harbin (CN); Xiyuan Peng, Harbin (CN)

(73) Assignee: Harbin Institute of Technology, Harbin (CN)

( * ) Notice: Subject to any disclaimer, the term of this patent is extended or adjusted under 35 U.S.C. 154(b) by 228 days.

(21) Appl. No.: 16/914,990

(22) Filed: Jun. 29, 2020

(65) Prior Publication Data

US 2021/0226830 A1 Jul. 22, 2021

(30) Foreign Application Priority Data

Jan. 16, 2020 (CN) .......................... 202010047641.8

(51) Int. Cl.
*H04L 27/26* (2006.01)
*G06F 7/72* (2006.01)
*G06F 17/16* (2006.01)

(52) U.S. Cl.
CPC .......... *H04L 27/2601* (2013.01); *G06F 7/729* (2013.01); *G06F 17/16* (2013.01)

(58) Field of Classification Search
CPC ..... H04L 27/2601; G06F 17/16; G06F 7/729; G06F 17/141; H03M 1/1285; H03M 7/30; G01R 23/16
See application file for complete search history.

(56) References Cited

U.S. PATENT DOCUMENTS 8,457,579 B2 * 6/2013 Mishali ................ H04B 1/0092
455/168.1
9,143,194 B2 * 9/2015 Eldar ...................... H03H 17/06
(Continued)

*Primary Examiner* — Dac V Ha
(74) *Attorney, Agent, or Firm* — IPro, PLLC; Na Xu

(57) ABSTRACT

The disclosure discloses a multiple sinusoid signal sub-Nyquist sampling method based on a multi-channel time delay sampling system. The method includes step 1: initializing; step 2: enabling multiple sinusoid signals x(t) to respectively enter N' parallel sampling channels after the multiple sinusoid signals are divided, wherein a sampling time delay of adjacent channels is τ, and the number of sampling points of each channel is N; step 3: combining sampled data of each sampling channel to construct an autocorrelation matrix $R_{xx}$, and estimating sampling signal parameters $c_m$ of each channel and a set of frequency parameters $\hat{f}_m$ by utilizing the ESPRIT method; step 4: estimating signal amplitudes $\alpha_m$ and another set of frequency parameters $\hat{f}_m{}'$ through the estimated parameters $c_m$ and the sampling time delay τ of each channel by utilizing the ESPRIT method; and step S: reconstructing 2K frequency parameters $\hat{f}_m$ through the two sets of estimated minimum frequency parameters $\hat{f}_m$ and $\hat{f}_m{}'$ by utilizing a closed-form robust Chinese remainder theorem, and screening out K correct frequency parameters $\{\hat{f}_k\}_{k=0}^{K-1}$ through sampling rate parameters. The disclosure is configured to solve problems of frequency aliasing and image frequency aliasing occurring in real-valued multiple sinusoid signal sub-Nyquist sampling.

6 Claims, 4 Drawing Sheets

(56) References Cited

U.S. PATENT DOCUMENTS

2006/0193371 A1\* 8/2006 Maravic ............. H03H 17/0213
　　　　　　　　　　　　　　　　　　　　375/130
2021/0126696 A1\* 4/2021 Kumar ...................... G01S 3/74

\* cited by examiner

MULTIPLE SINUSOID SIGNAL SUB-NYQUIST SAMPLING METHOD BASED ON MULTI-CHANNEL TIME DELAY SAMPLING SYSTEM

The disclosure belongs to the technical field of signal processing, and particularly relates to a multiple sinusoid signal sub-Nyquist sampling method based on a multi-channel time delay sampling system.

BACKGROUND

Multiple sinusoid signals are the superposition of a plurality of sinusoidal signals, and are signals widely existing in the fields such as communication, radar, medical devices and frequency domain measurement. According to the Nyquist sampling theorem, in order to recover analog signals from discrete samples without distortion, a sampling rate must be at least twice a signal bandwidth. With the development of modern information technologies, the bandwidth of the multiple sinusoid signals is increased gradually, and the pressure of sampling equipment is also increased accordingly. Therefore, the Nyquist sampling theorem has gradually become a bottleneck in the design of a multiple sinusoid signal sampling system, which restricts the development of signal processing technologies.

The multiple sinusoid signals are signals capable of being characterized by a limited number of parameters, namely frequency, amplitude and phase parameters.

Many sub-Nyquist sampling solutions for the multiple sinusoid signals have been proposed currently. Zoltowski et al. from outside China proposed a method for estimating frequencies by combining delay sampling with spatial spectrum estimation. However, under certain conditions, the estimated frequencies are not completely accurate. Meanwhile, the method requires a sampling time difference between sampling channels smaller than a signal Nyquist interval, and when the signal frequencies are higher, great design difficulties will be brought to hardware trigger. Some scholars proposed the analog-to-information convertor (AIC) technology based on the compressive sensing theory, for example, sub-Nyquist sampling and frequency estimation of the multiple sinusoid signals can be realized through structures of a random demodulator (RD), random sampling (RS), randomly triggered modulated wideband compressive sampling (RT-MWCS), etc., however random sampling in the method is difficult to realize in hardware, the accuracy of estimation depends on the density of frequency grids, and usually, in order to consider the complexity of calculation, the density of the grids is not high, so the accuracy of recovery is usually not high. Some scholars propose estimating the frequencies of the multiple sinusoid signals through dual-channel sampling, however, the frequencies estimated by the method are sometimes not unique, in order to improve the method, a research team from Huazhong University of Science and Technology in China proposes a method for solving frequency aliasing through co-prime sampling of three sampling channels, however, the method requires a large number of samples. Many scholars at home and abroad have studied a signal frequency estimation method based on a Chinese remainder theorem (CRT), however, these methods usually can only estimate sinusoidal signals of single frequencies, and most of them are designed for complex signals, so they cannot complete frequency estimation of real signals. So far, there has been no anti-aliasing sub-Nyquist sampling solution which needs a few samples and is easy to realize for the real-valued multiple sinusoid signals. Therefore, it is very necessary to design a simple and effective sub-Nyquist sampling structure which can solve the problems of frequency aliasing and image frequency aliasing.

SUMMARY

The disclosure provides a multiple sinusoid signal sub-Nyquist sampling method based on a multi-channel time delay sampling system, which is configured to solve problems of frequency aliasing and image frequency aliasing occurring in real-valued multiple sinusoid signal sub-Nyquist sampling.

The disclosure is implemented through the following technical solutions:

A multiple sinusoid signal sub-Nyquist sampling method based on a multi-channel time delay sampling system, specifically including:

step 1: initializing;

step 2: enabling multiple sinusoid signals x(t) to respectively enter N' parallel sampling channels after the multiple sinusoid signals are divided, and enabling each sampling channel to evenly sample the signals at a low speed with the same sampling rate, wherein a sampling time delay of adjacent channels is τ, and the number of sampling points of each channel is N;

step 3: combining sampled data of each sampling channel to construct an autocorrelation matrix $R_{xx}$, and estimating sampling signal parameters $c_m$ of each channel and a set of frequency parameters $\hat{f}_m$ by utilizing the ESPRIT method;

step 4: estimating signal amplitudes $\alpha_m$ and another set of frequency parameters $\hat{f}_m{}'$ through the estimated parameters $c_m$ and the sampling time delay τ of each channel by utilizing the ESPRIT method; and step 5: reconstructing 2K frequency parameters $\hat{f}_m$ through the two sets of estimated minimum frequency parameters $\hat{f}_m$ and $f_m{}'$ by utilizing a closed-form robust Chinese remainder theorem, and screening out K correct frequency parameters $\{\hat{f}_k\}_{k=0}^{K-1}$ through sampling rate parameters.

Further, step 1 is specifically: it is assumed that the to-be-sampled multiple sinusoid signal x(t) is composed of K frequency components and expressed as:

$$x(t) = \sum_{k=0}^{K-1} a_k \cos(2\pi f_k t + \varphi_k). \tag{7}$$

$f_k$ is a $k^{th}$ frequency component of the signal, $\varphi_k$ is a phase of the signal, $\alpha_k(\alpha_k \neq 0, \alpha_k \in \mathbb{R})$ is an amplitude parameter of the signal, and T is a duration of the signal. An Euler formula $e^{jt} = \cos t + j \sin t$ is utilized, and the formula (7) is rewritten as:

$$\begin{aligned} x(t) &= \sum_{k=0}^{K-1} a_k \cos(2\pi f_k t + \varphi_k) \\ &= \frac{1}{2}\sum_{k=0}^{K-1} a_k(e^{j(2\pi f_k t + \varphi_k)} + e^{-j(2\pi f_k t + \varphi_k)}) \\ &= \frac{1}{2}\sum_{m=0}^{2K-1} c_m e^{j2\pi f_m t}, t \in [0, T), \end{aligned} \tag{8}$$

wherein $$c_m = \begin{cases} a_m e^{j\varphi_m} & 0 \le m \le K-1 \\ a_{m-K} e^{-j\varphi_m} & K \le m \le 2K-1 \end{cases}, \quad (9)$$

and $$f_m = \begin{cases} f_m & 0 \le m \le K-1 \\ -f_{m-k} & K \le m \le 2K-1 \end{cases}. \quad (10)$$

In this way, a real signal solving problem of the K frequency components is transformed into a complex exponential signal solving problem of 2K frequency components, and it is assumed that a maximum frequency component $f_{max}$ of the signal is known a priori, namely $0 \le f_k < f_{max}$, $\forall k \in \{0,1,\ldots,K-1\}$ Meanwhile, the signal sampling rate and a time delay should meet:

$$\frac{\Gamma\Gamma'M}{2} > f_{max}. \quad (11)$$

M is a greatest common divisor of the sampling rate $f_s$ and a time delay reciprocal $$\frac{1}{\tau},$$

$\Gamma$ and $\Gamma'$ are respectively quotients of $f_s$ and $$\frac{1}{\tau}$$

divided by M, and $\Gamma$ and $\Gamma'$ are prime numbers of each other.

Further, step 2 is specifically: the sampling channels evenly sample the signals with the sampling rate $f_s \le f_{max}$ and a sampling value of an n'th channel is expressed as:

$$x_{n'}[n] = \sum_{m=0}^{2K-1} c_m e^{-j2\pi n' f_k \tau} e^{j2\pi n f_k / f_s}, \; 0 \le n < N. \quad (12)$$

n'=0,1, ..., N'−1

Further, step 3 is specifically:
$x_{n',i'} = [x_{n'}[i'], x_{n'}[i'+1], x_{n'} \ldots x_{n'}[i'+2K]]$ is made to include 2K+1 continuous sampling values to construct the autocorrelation matrix $$R_{xx} = \sum_{n'=0}^{N'-1} \sum_{i'=0}^{I-1} x_{n',i'} (x_{n',i'})^H. \quad (13)$$

I=N−K is the number of vectors $x_{n',i'}$ capable of being composed of the sampling values of each channel. If no image frequency aliasing exists, a sampling condition of $$N' \ge 2, N \ge \left\lceil 2K + \frac{2K}{N'} \right\rceil$$

ensures that a rank of the autocorrelation matrix $R_{xx}$ is 2K, and a requirement of an ESPRIT algorithm for an input matrix is met. If image frequency aliasing exists, N'≥4K, N≥4K is a sufficient and unnecessary condition to ensure that the rank of the autocorrelation matrix $R_{xx}$ meets the requirement of the ESPRIT algorithm, then the autocorrelation matrix $R_{xx}$ is solved by utilizing the ESPRIT algorithm, a set of frequency parameter minimum solutions $\{\hat{f}_m\}_{m=0}^{2K-1}$ is obtained, the set of solutions meets $\hat{f}_k + \hat{f}_{2K-k-1} = f_s$, and meanwhile, a series of amplitudes $\{c_m e^{-j2\pi n' f_m \tau}\}_{n'=0,1,\ldots,N'-1}^{m=0,1,\ldots,2K-1}$ are further obtained by utilizing the ESPRIT algorithm to solve the matrix $R_{xx}$.

Further, step 4 is specifically:

$$\tau > \frac{1}{f_{max}}$$

is set, the amplitudes $\{c_m e^{-j2\pi n' f_m \tau}\}_{n'=0,1,\ldots,N'-1}^{m=0,1,\ldots,2K-1}$ serve as a single sinusoid sampling process, and $\{f_m', c_m\}_{m=0}^{2K-1}$ is obtained through the same method as step 3. $\hat{f}_m$ is a frequency parameter minimum solution under a virtual sampling rate $$\frac{1}{\tau},$$

and $c_m$ includes an amplitude and phase information of a real-valued multiple sinusoid signal as defined in the formula (9).

Further, step 5 is specifically: 2K−1 positive frequency estimation values $\{\hat{f}_m\}_m^{2K-1}$ are solved through the two sets of solved frequency parameter minimum solutions $\{f_m, f_m'\}_m^{2K-1}$ by utilizing the closed-form robust Chinese remainder theorem, and K frequencies $$\left\{\hat{f}_k \,\Big|\, \hat{f}_k \le \frac{\Gamma\Gamma'M}{2}\right\}_{k=0}^{K-1}$$

are selected therefrom as frequency values of K real-valued multiple sinusoid signals.

The disclosure has the beneficial effects:

The multiple sinusoid signal sub-Nyquist sampling method based on the multi-channel time delay sampling system is provided, the multiple sinusoid signal parameters can be estimated by combining the sampled data of the plurality of channels, the number of the sampling points required for each sampling channel is reduced, and the robustness of the algorithm is improved by using the closed-form robust Chinese remainder theorem. Meanwhile, combined reconstruction of the multi-channel data can effectively improve a signal-to-noise ratio of the processed signals, and the parameter estimation accuracy of the algorithm is improved.

The time delay between all the sampling channels is allowed to be much larger than the Nyquist interval of the signals, and the difficulty of sampling trigger is greatly lowered. Meanwhile, compared with other sub-Nyquist sampling algorithms, a sampling system can directly process the real signals.

DETAILED DESCRIPTION

Figure 1:
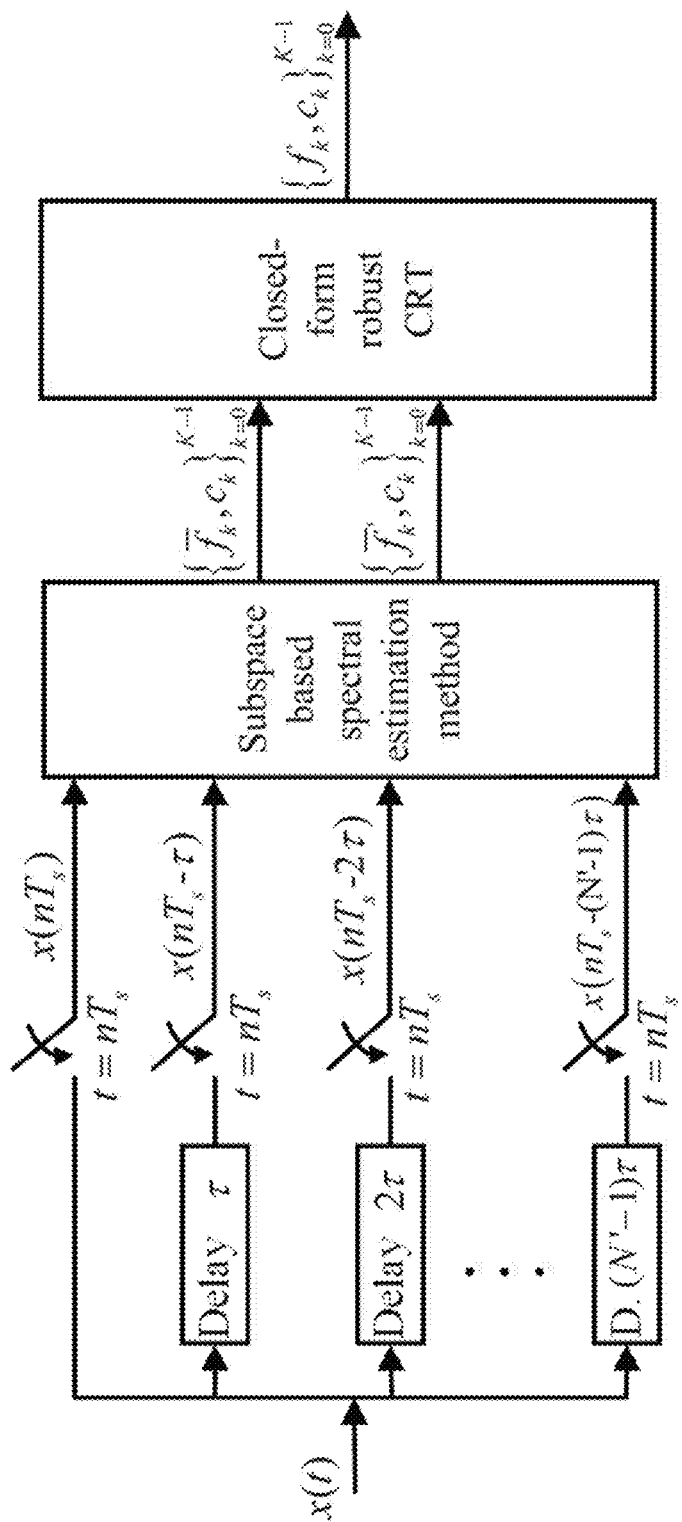
FIG. 1 is a block diagram of a multi-channel time delay sampling system of the disclosure.

The technical solutions in embodiments of the disclosure will be described clearly and completely below in combination with accompanying drawings in the embodiments of the disclosure, and obviously, the embodiments described are only a part of the embodiments of the disclosure, and not all of them. Based on the embodiments in the disclosure, all other embodiments obtained by those of ordinary skill in the art without creative labor are all within the protection scope of the disclosure.

Embodiment 1

According to a multiple sinusoid signal sub-Nyquist sampling method based on a multi-channel time delay sampling system, the sampling method is specifically: there are N'≥2 adjacent and parallel sampling channels with time delays τ, sampling rates of the N' channels are the same, and there is a relative delay in sampling time of the N' channels.

Step 1: initialization is conducted.

Step 2: after being divided, multiple sinusoid signals x(t) respectively enter N' parallel sampling channels, each sampling channel evenly samples the signals at a low speed with the same sampling rate, a sampling time delay of adjacent channels is r, and the number of sampling points of each channel is N.

Step 3: sampled data of each sampling channel are combined to construct an autocorrelation matrix $R_{xx}$, and sampling signal parameters $c_m$ of each channel and a set of frequency parameters $\tilde{f}_m$ are estimated by utilizing the ESPRIT method.

Step 4: signal amplitudes $\alpha_m$ and another set of frequency parameters $\tilde{f}_m'$ are estimated through the estimated parameters $c_m$ and the sampling time delay τ of each channel by utilizing the ESPRIT method.

Step 5: 2K frequency parameters $\hat{f}_m$ are reconstructed through the two sets of estimated minimum frequency parameters $\tilde{f}_m$ and $\tilde{f}_m'$ by utilizing a closed-form robust Chinese remainder theorem, and K correct frequency parameters $\{\hat{f}_k\}_{k=0}^{K-1}$ are screened out through sampling rate parameters.

Further, step 1 is specifically: it is assumed that the to-be-sampled multiple sinusoid signal x(t) is composed of K frequency components and expressed as:

$$x(t) = \sum_{k=0}^{K-1} a_k \cos(2\pi f_k t + \varphi_k). \quad (7)$$

$f_k$ is a $k^{th}$ frequency component of the signal, $\varphi_k$ is a phase of the signal, $\alpha_k(\alpha_k \neq 0, \alpha_k \in \mathbb{R})$ is an amplitude parameter of the signal, and T is a duration of the signal. An Euler formula $e^{jt} = \cos t + j \sin t$ is utilized, and the formula (7) is rewritten as:

$$x(t) = \sum_{k=0}^{K-1} a_k \cos(2\pi f_k t + \varphi_k) \quad (8)$$

$$= \frac{1}{2}\sum_{k=0}^{K-1} a_k (e^{j(2\pi f_k t + \varphi_k)} + e^{-j(2\pi f_k t + \varphi_k)})$$

$$= \frac{1}{2}\sum_{m=0}^{2K-1} c_m e^{j2\pi f_m t}, \; t \in [0, T),$$

wherein $$c_m = \begin{cases} a_m e^{j\varphi_m} & 0 \le m \le K-1 \\ a_{m-K} e^{-j\varphi_m} & K \le m \le 2K-1 \end{cases}, \quad (9)$$

and $$f_m = \begin{cases} f_m & 0 \le m \le K-1 \\ -f_{m-K} & K \le m \le 2K-1 \end{cases}. \quad (10)$$

In this way, a real signal solving problem of the K frequency components is transformed into a complex exponential signal solving problem of 2K frequency components, and it is assumed that a maximum frequency component $f_{max}$ of the signal is known a priori, namely $0 \le f_k < f_{max}, \forall k \in \{0, 1, \ldots, K-1\}$. Meanwhile, the signal sampling rate and a time delay should meet:

$$\frac{\Gamma\Gamma'M}{2} > f_{max}. \quad (11)$$

M is a greatest common divisor of the sampling rate $f_s$ and a time delay reciprocal $$\frac{1}{\tau},$$

$\Gamma$ and $\Gamma'$ are respectively quotients of $f_s$ and $$\frac{1}{\tau}$$

and divided by M, and $\Gamma$ and $\Gamma'$ are prime numbers of each other.

Further, step 2 is specifically: the sampling channels evenly sample the signals with the sampling rate $f_s \le f_{max}$ and a sampling value of an $n^{th}$ channel is expressed as:

$$x_{n'}[n] = \sum_{m=0}^{2K-1} c_m e^{-j2\pi n' f_k \tau} e^{j2\pi n f_k / f_s}, \; 0 \le n < N. \quad (12)$$

n'=0,1, . . . , N'−1

Further, step 3 is specifically:

$x_{n',i'} = [x_{n'}[i'], x_{n'}[i'+1], x_{n'}, \ldots, x_{n'}[i'+2K]]$ is made to include 2K+1 continuous sampling values to construct the autocorrelation matrix $$R_{xx} = \sum_{n'=0}^{N'-1} \sum_{i'=0}^{I-1} x_{n',i'} (x_{n',i'})^H. \qquad (13)$$

I=N−K is the number of vectors $x_{n',i'}$ capable of being composed of the sampling values of each channel. If no image frequency aliasing exists, a sampling condition of $$N' \geq 2, N \geq \left\lceil 2K + \frac{2K}{N'} \right\rceil$$

ensures that a rank of the autocorrelation matrix $R_{xx}$ is 2K, and a requirement of an ESPRIT algorithm for an input matrix is met. If image frequency aliasing exists, N'≥4K, N≥4K is a sufficient and unnecessary condition to ensure that the rank of the autocorrelation matrix $R^{xx}$ meets the requirement of the ESPRIT algorithm, then the autocorrelation matrix $R_{xx}$ is solved by utilizing the ESPRIT algorithm, a set of frequency parameter minimum solutions $\{\bar{f}_m\}_{m=0}^{2K-1}$ is obtained, the set of solutions meets $\bar{f}_k + \bar{f}_{2K-k-1} = f_s$, and meanwhile, a series of amplitudes $\{c_m e^{-j2\pi n' \bar{f}_m \tau}\}_{n'=0,1,\ldots,N'-1}^{m=0,1,\ldots,2K-1}$ are further obtained by utilizing the ESPRIT algorithm to solve the matrix $R_{xx}$.

Further, step 4 is specifically:

$$\tau > \frac{1}{f_{max}}$$

is set, the amplitudes $\{c_m e^{-j2\pi n' \bar{f}_m \tau}\}_{n'=0,1,\ldots,N'-1}^{m=0,1,\ldots,2K-1}$ serve as a single sinusoid sampling process, and $\{\bar{f}_m', c_m\}_{m=0}^{2K-1}$ is obtained through the same method as step 3. $\bar{f}_m'$ is a frequency parameter minimum solution under a virtual sampling rate $$\frac{1}{\tau},$$

and $c_m$ includes an amplitude and phase information of a real-valued multiple sinusoid signal as defined in the formula (9).

Further, step 5 is specifically: 2K−1 positive frequency estimation values $\{\hat{f}_m\}_m^{2K-1}$ are solved through the two sets of solved frequency parameter minimum solutions $\{f_m, f_m'\}_m^{2K-1}$ by utilizing the closed-form robust Chinese remainder theorem, and K frequencies $$\left\{ \hat{f}_k \, \middle| \, \hat{f}_k \leq \frac{\Gamma \Gamma' M}{2} \right\}_{k=0}^{K-1}$$

are selected therefrom as frequency values of K real-valued multiple sinusoid signals.

Embodiment 2

Noiseless Experiment

The number of frequency components of a to-be-measured signal is set to be K=4, a maximum frequency of the signals is set to be 60 MHz, a sampling rate of each delay channel is $f_s$=30 MHz and a sampling time delay of each channel is $$\tau = \frac{1}{40} \, \mu s.$$

Figure 2:
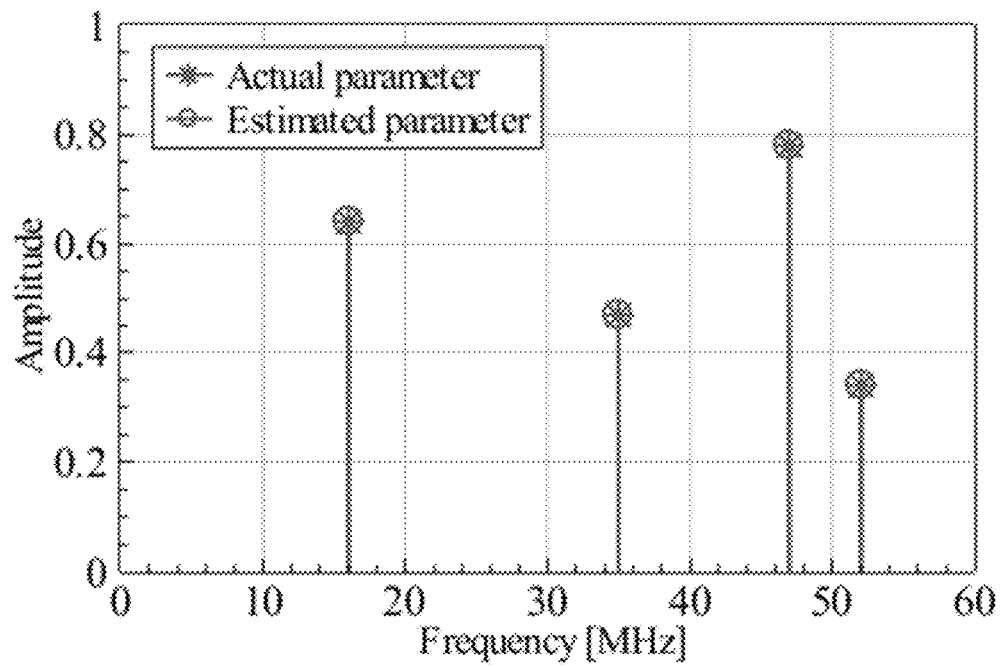
FIG. 2 is a result diagram of signal parameter estimation in the absence of image frequency aliasing of the disclosure.
Figure 3:
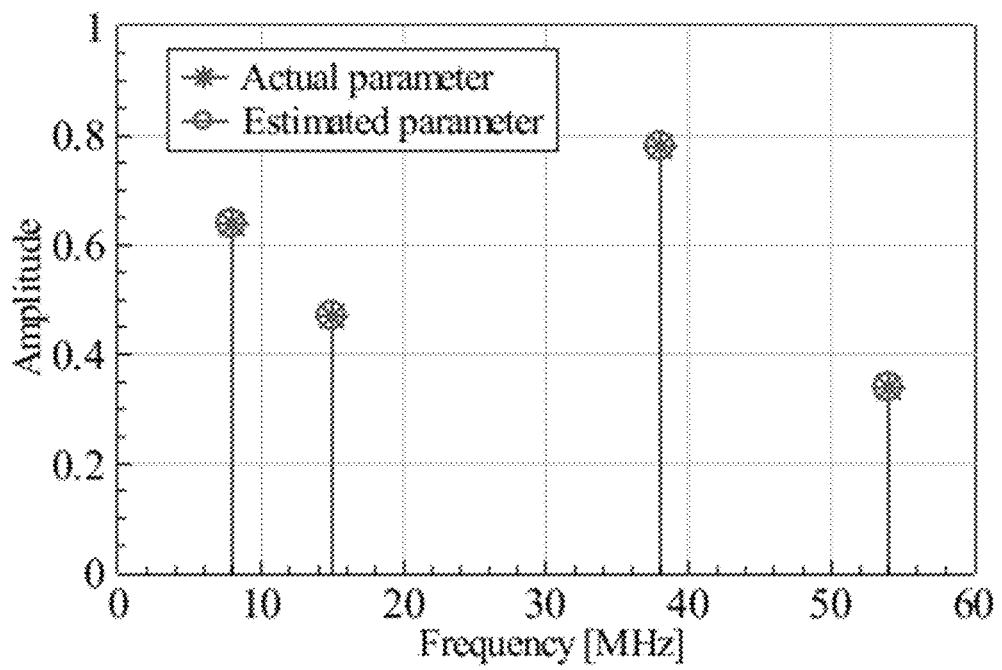
FIG. 3 is a result diagram of signal parameter estimation in the presence of image frequency aliasing of the disclosure.

In the absence of signal image frequency aliasing, the number of sampling channels is set to be N'=2, and the number of sampling points of each channel is N=12. FIG. 2 shows a reconstruction effect of signal amplitudes $\alpha_k$ and frequency parameters $f_k$. In the presence of signal image frequency aliasing, the number of the sampling channels is set to be N'=16, and the number of the sampling points of each channel is N=16. FIG. 3 shows a reconstruction effect of the signal amplitudes $\alpha_k$ and the frequency parameters $f_k$. It can be seen that in both cases of the absence of signal image frequency aliasing and the presence of signal image frequency aliasing, a sampling structure and method reconstruct the amplitude parameters and frequency parameters of the signals without errors.

Embodiment 3

Noise Experiment

The number of frequency components of a to-be-measured signal is set to be K=4, a maximum frequency of the signals is set to be 100 MHz, no signal image frequency aliasing exists, a sampling rate of each delay channel is $f_s$=14 MHz, and a sampling time delay of each channel is $$\tau = \frac{1}{17} \, \mu s.$$

Figure 4:
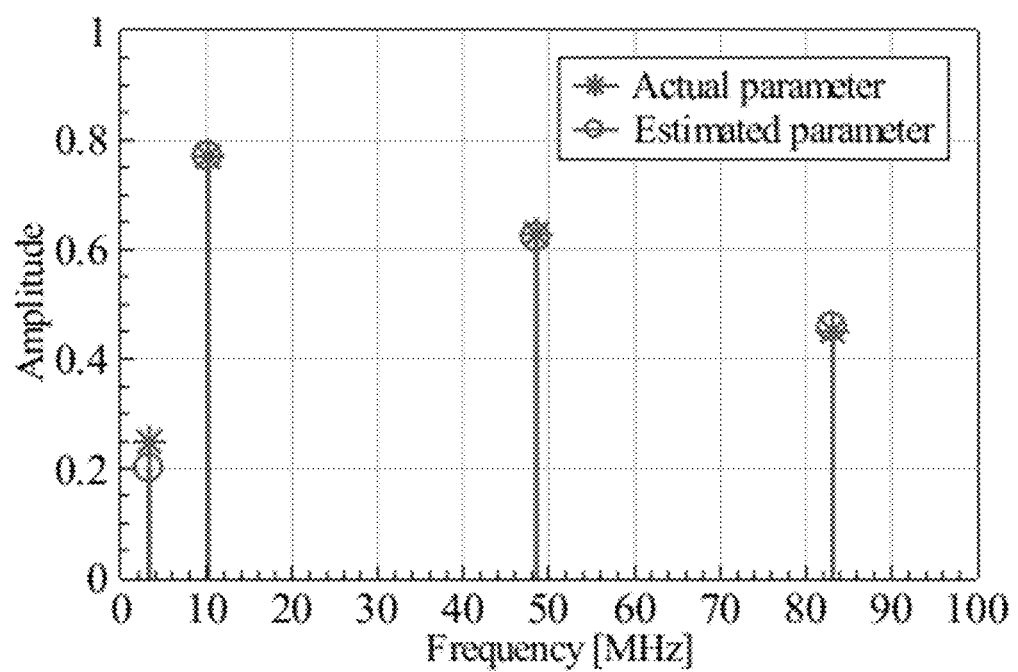
FIG. 4 is a result diagram of parameter estimation with a signal-to-noise ratio being 10 dB of the disclosure.
Figure 5A:
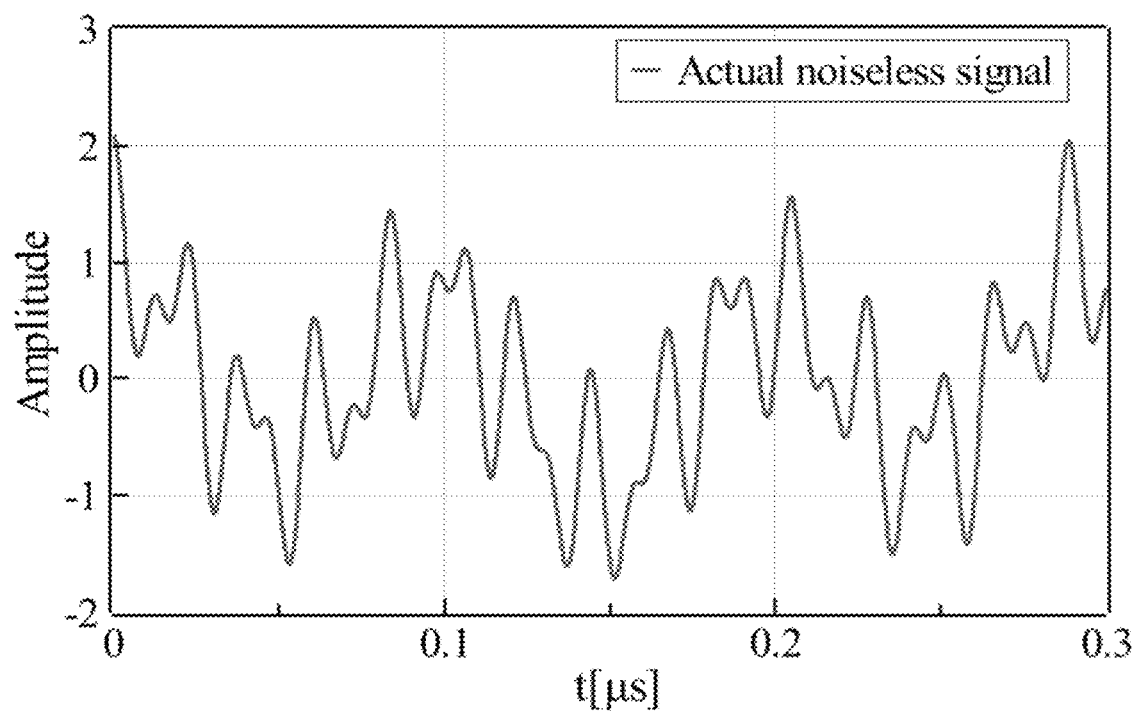
FIG. 5A-5B is a result of time domain waveform reconstruction with a signal-to-noise ratio being 10 dB of the disclosure.
Figure 5B:
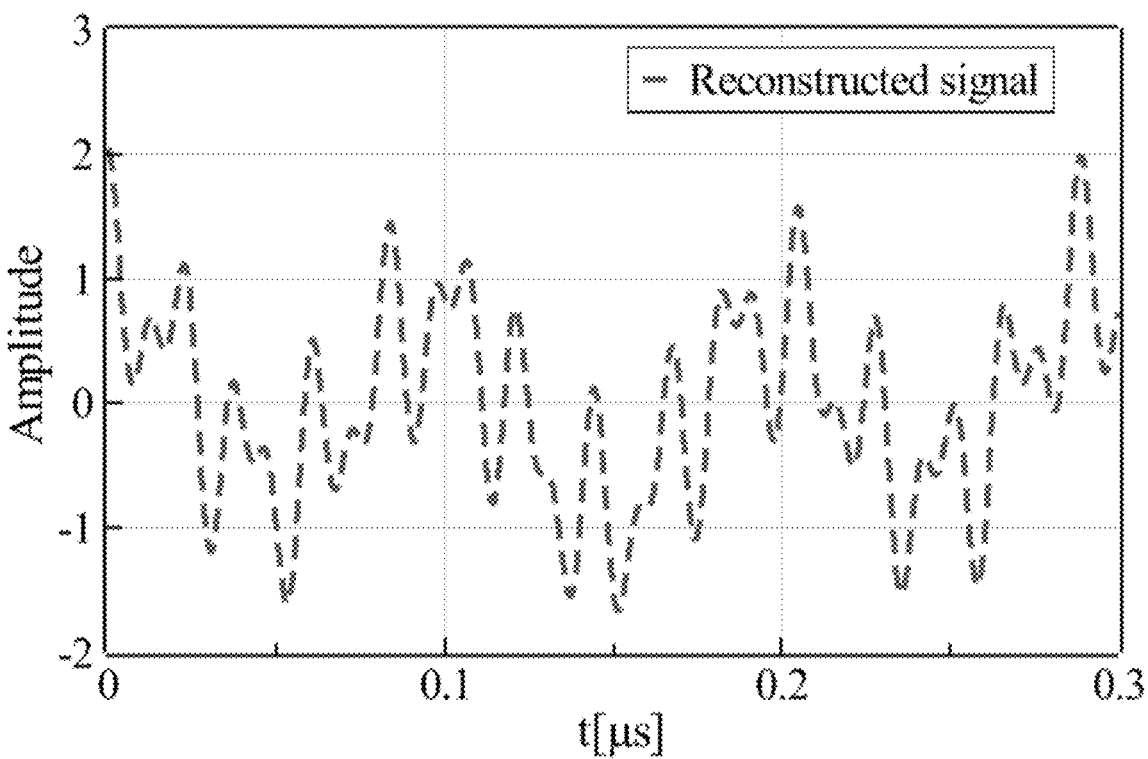

The number of sampling channels is set to be N'=4, the number of sampling points of each channel is N=50, and a signal-to-noise ratio is 10 dB. FIG. 4 shows a reconstruction effect of signal amplitudes $\alpha_k$ and frequency parameters $f_k$. FIG. 5 shows a reconstruction effect of a time domain waveform of the signals. Experimental results show that in the case that the signal-to-noise ratio is 10 dB, a sampling structure and method can estimate signal parameters well and recover the time domain waveform of the signals.

What is claimed is:

1. A multiple sinusoid signal sub-Nyquist sampling method based on a multi-channel time delay sampling system, specifically comprising:
   step 1: initializing;
   step 2: enabling multiple sinusoid signals x(t) to respectively enter N' parallel sampling channels after the multiple sinusoid signals are divided, and enabling each sampling channel to evenly sample the signals with the same sampling rate, wherein a sampling time delay of adjacent channels is τ, and the number of sampling points of each channel is N, wherein N and N' are positive integers;
   step 3: combining sampled data of each sampling channel to construct an autocorrelation matrix $R_{xx}$, and estimating sampling signal parameters $C_m$ of each channel and a set of frequency parameters $\bar{f}_m$ by utilizing the ESPRIT method;
   step 4: estimating signal amplitudes $\alpha_m$ and another set of frequency parameters $\bar{f}_m'$ through the estimated parameters $c_m$ and the sampling time delay τ of each channel by utilizing the estimation of signal parameters via rotational invariant techniques (ESPRIT); and
   step 5: reconstructing 2K frequency parameters $\hat{f}_m$ through the two sets of estimated minimum frequency parameters $\tilde{f}_m$ and $\tilde{f}_m'$ by utilizing a closed-form robust Chinese remainder theorem, and screening out K correct frequency parameters $\{\hat{f}_k\}_{k=0}^{K-1}$ through sampling rate parameters, wherein K is a positive integer.

2. The sampling method according to claim 1, wherein step 1 is specifically: it is assumed that the to-be-sampled multiple sinusoid signal x(t) is composed of K frequency components and expressed as:

$$x(t) = \sum_{k=0}^{K-1} a_k \cos(2\pi f_k t + \varphi_k), \quad (7)$$

wherein $f_k$ is a $k^{th}$ frequency component of the signal, $\varphi_k$ is a phase of the signal, $\alpha_k (\alpha_k \neq 0, \alpha_k \in \mathbb{R})$ is an amplitude parameter of the signal, and T is a duration of the signal; and Euler formula $e^{jt} = \cos t + j \sin t$ is utilized, and the formula (7) is rewritten as:

$$\begin{aligned} x(t) &= \sum_{k=0}^{K-1} a_k \cos(2\pi f_k t + \varphi_k) \\ &= \frac{1}{2} \sum_{k=0}^{K-1} a_k (e^{j(2\pi f_k t + \varphi_k)} + e^{-j(2\pi f_k t + \varphi_k)}) \\ &= \frac{1}{2} \sum_{m=0}^{2K-1} c_m e^{j2\pi f_m t}, \quad t \in [0, T), \end{aligned} \quad (8)$$

wherein $$c_m = \begin{cases} a_m e^{j\varphi_m} & 0 \leq m \leq K-1 \\ a_{m-k} e^{-j\varphi_n} & K \leq m \leq 2K-1 \end{cases}, \quad (9)$$

$$f_m = \begin{cases} f_m & 0 \leq m \leq K-1 \\ -f_{m-k} & K \leq m \leq 2K-1 \end{cases}, \quad (10)$$

in this way, a real signal solving problem of the K frequency components is transformed into a complex exponential signal solving problem of 2K frequency components, and it is assumed that a maximum frequency component $f_{max}$ of the signal is known a priori, namely $0 \leq f_k < f_{max}, \forall k \in \{0, 1, \ldots, K-1\}$; and meanwhile, the signal sampling rate and a time delay meets:

$$\frac{\Gamma \Gamma' M}{2} > f_{max}, \quad (11)$$

wherein M is a greatest common divisor of the sampling rate $f_s$ and a time delay reciprocal $$\frac{1}{\tau},$$

$\Gamma$ and $\Gamma'$ are respectively quotients of $f_s$ and $$\frac{1}{\tau}$$

divided by M, and $\Gamma$ and $\Gamma'$ are prime numbers of each other.

3. The sampling method according to claim 1, wherein step 2 is specifically: the sampling channels evenly sample the signals with the sampling rate $f_s \leq f_{max}$, and a sampling value of an $n^{th}$ channel is expressed as:

$$x_{n'}[n] = \sum_{m=0}^{2K-1} c_m e^{-j2\pi n' f_k \tau} e^{j2\pi n f_k / f_s}, 0 \leq n < N, \quad (12)$$

wherein n'=0,1, . . . , N'−1.

4. The sampling method according to claim 1, wherein step 3 is specifically: $x_{n',i'} = [x_{n'}[i'], x_{n'}[i'+1], x_{n'}, \ldots, x_{n'}[i'+2K]]$ is made to comprise 2K+1 continuous sampling values to construct the autocorrelation matrix $$R_{xx} = \sum_{n'=0}^{N'-1} \sum_{i'=0}^{I-1} x_{n',i'} (x_{n',i'})^H, \quad (13)$$

wherein I=N−K is the number of vectors $x_{n',i'}$ capable of being composed of the sampling values of each channel; if no image frequency aliasing exists, a sampling condition of $$N' \geq 2, N \geq \left\lceil 2K + \frac{2K}{N'} \right\rceil$$

ensures that a rank of the autocorrelation matrix $R_{xx}$ is 2K, and a requirement of an ESPRIT algorithm for an input matrix is met; and if image frequency aliasing exists, N'≥4K, N≥4K is a sufficient and unnecessary condition to ensure that the rank of the autocorrelation matrix $R_{xx}$ meets the requirement of the ESPRIT algorithm, then the autocorrelation matrix $R_{xx}$ is solved by utilizing the ESPRIT algorithm, a set of frequency parameter minimum solutions $\{\tilde{f}_m\}_{m=0}^{2K-1}$ is obtained, the set of solutions meets $\tilde{f}_k + \tilde{f}_{2K-k-1} = f_s$, and meanwhile, a series of amplitudes $\{c_m e^{-j2\pi n' f_m \tau}\}_{n'=0,1,\ldots,N'-1}^{m=0,1,\ldots,2K-1}$ are further obtained by utilizing the ESPRIT algorithm to solve the matrix $R_{xx}$.

5. The sampling method according to claim 1, wherein step 4 is specifically:

$$\tau > \frac{1}{f_{max}}$$

is set, amplitudes $\{c_m e^{-j2\pi n' f_m \tau}\}_{n'=0,1,\ldots,N'-1}^{m=0,1,\ldots,2K-1}$ serve as a single sinusoid sampling process, and $\{\tilde{f}_m', c_m\}_{m=0}^{2K-1}$ is obtained through the same method as step 3, wherein $\tilde{f}_m'$ is a frequency parameter minimum solution under a virtual sampling rate $$\frac{1}{\tau},$$

and $c_m$ comprises an amplitude and phase information of a real-valued multiple sinusoid signal as defined in a formula (9).

6. The sampling method according to claim 1, wherein step 5 is specifically: 2K−1 positive frequency estimation values $\{\hat{f}_m\}_m^{2K-1}$ are solved through the two sets of solved frequency parameter minimum solutions $\{\bar{\mathrm{f}}_m, \bar{\mathrm{f}}_m{}'\}_m{}^{2K-1}$ by utilizing the closed-form robust Chinese remainder theorem, and K frequencies $$\left\{\hat{f}_k \,\Big|\, \hat{f}_k \leq \frac{\Gamma\Gamma'M}{2}\right\}_{k=0}^{K-1}$$

are selected therefrom as frequency values of K real-valued multiple sinusoid signals.

* * * * *